(12) United States Patent
Hu

(10) Patent No.: US 10,347,340 B2
(45) Date of Patent: Jul. 9, 2019

(54) MEMORY ARRAY AND METHOD FOR READING, PROGRAMMING AND ERASING THE SAME

(71) Applicant: Shanghai Huahong Grace Semiconductor Manufacturing Corporation, Shanghai (CN)

(72) Inventor: Jian Hu, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 15/844,806

(22) Filed: Dec. 18, 2017

(65) Prior Publication Data
US 2018/0322927 A1    Nov. 8, 2018

(30) Foreign Application Priority Data

May 3, 2017    (CN) .......................... 2017 1 0306183

(51) Int. Cl.
| G11C 16/04 | (2006.01) |
| G11C 16/16 | (2006.01) |
| G11C 11/56 | (2006.01) |
| H01L 29/423 | (2006.01) |
| G11C 16/10 | (2006.01) |
| G11C 16/26 | (2006.01) |
| H01L 27/11517 | (2017.01) |

(52) U.S. Cl.
CPC .......... *G11C 16/16* (2013.01); *G11C 11/5642* (2013.01); *G11C 16/0425* (2013.01); *G11C 16/10* (2013.01); *G11C 16/26* (2013.01); *H01L 29/42324* (2013.01); *G11C 11/5635* (2013.01); *H01L 27/11517* (2013.01)

(58) Field of Classification Search
CPC ...................................................... G11C 16/02
USPC ..................................................... 365/185.29
See application file for complete search history.

(56) References Cited

U.S. PATENT DOCUMENTS

| 9,640,252 B1* | 5/2017 | Yang | .................... G11C 11/5628 |
| 2014/0169099 A1* | 6/2014 | Gu | .................... H01L 21/28273 |
| | | | 365/185.18 |
| 2014/0177333 A1* | 6/2014 | Yang | ........................ G11C 8/08 |
| | | | 365/185.2 |

* cited by examiner

*Primary Examiner* — Hoai V Ho
(74) *Attorney, Agent, or Firm* — Harness, Dickey & Pierce, P.L.C.

(57) ABSTRACT

A memory array and a method for reading, programming and erasing the same are provided. The memory array includes flash memory cells arranged in an array, each flash memory cell includes a first and a second split-gate flash memory cell; a first control gate of the first split-gate flash memory cell is connected with a first control gate of the second split-gate flash memory cell and a first control gate line, a second control gate of the first split-gate flash memory cell is connected with a second control gate of the second split-gate flash memory cell and a second control gate line; a word line gate of the first split-gate flash memory cell is connected with a word line gate of the second split-gate flash memory cell and a word line; two drains of the first and second split-gate flash memory cells share a same bit line.

5 Claims, 4 Drawing Sheets

MEMORY ARRAY AND METHOD FOR READING, PROGRAMMING AND ERASING THE SAME

CROSS-REFERENCE TO RELATED APPLICATIONS

This application claims the benefit of priority to Chinese Patent Application No. 201710306183.3, titled "MEMORY ARRAY AND METHOD FOR READING, PROGRAMMING AND ERASING THE SAME", filed on May 3, 2017, the entire disclosure of which are incorporated herein by reference.

TECHNICAL FIELD

The present disclosure relates to memory technology field, and more particularly to a memory array and a method for reading, programming and erasing the memory array.

BACKGROUND

Flash, as a non-volatile memory, has become a mainstream of non-volatile semiconductor memory technology recently. A variety of flash memory devices may basically have two types of structure, i.e. stacked gate structure and split gate structure. An over-erasing problem may exist in the stacked gate structure, making the circuit design complicated. In contrast, the split gate structure can effectively avoid the over-erasing effect, making the circuit design relatively simple. In addition, compared with the stacked gate structure, a higher programming efficiency can be achieved in the split gate structure due to the programming via source-side hot electron injection, which makes the split-gate flash memory widely used in various electronic products such as smart cards, SIM cards, microcontrollers and cell phones etc.

In a split-gate flash memory, each split-gate flash memory cell may respectively include a source, a drain, a first control gate, a word line gate and a second control gate, where the source and the drain of each split-gate flash memory cell are respectively connected with a corresponding bit line, the word line gate is connected with a word line, and the first control gate and the second control gate are respectively connected with a corresponding control gate line. That is, each split-gate flash memory cell is generally connected with two bit lines.

A memory may include a memory array and other circuit modules, such as a sensitive amplifier (SA), a decoder and the like. Since an area of the memory array is closely related to cost of the memory, how to reduce an area of the memory array continuously is always a technical problem faced by designers in the memory design.

SUMMARY

A memory array and a method for reading, programming and erasing the memory array are provided in the present disclosure, so as to effectively reduce an area of the memory array.

In some embodiments, the memory array may include: a plurality of flash memory cells arranged in an array, wherein each of the plurality of flash memory cells comprises a first split-gate flash memory cell and a second split-gate flash memory cell, each of the first split-gate flash memory cell and the second split-gate flash memory cell comprises a source, a drain, a first control gate, a word line gate and a second control gate; the first control gate of the first split-gate flash memory cell is connected with the first control gate of the second split-gate flash memory cell and a first control gate line, the second control gate of the first split-gate flash memory cell is connected with the second control gate of the second split-gate flash memory cell and a second control gate line; the word line gate of the first split-gate flash memory cell is connected with the word line gate of the second split-gate flash memory cell and a word line; and the source of the first split-gate flash memory cell is connected with a first bit line via a contact, the drain of the first split-gate flash memory cell is connected with a second bit line via a contact, the drain of the second split-gate flash memory cell is connected with the second bit line via a contact, and the source of the second split-gate flash memory cell is connected with a third bit line via a contact.

In some embodiments, for a first flash memory cell and a second flash memory cell adjacent to each other in the flash memory cells in each row of the memory array, contacts leading out of two drains of the first flash memory cell and contacts leading out of two sources of the second flash memory cell are disposed on a same extension line in the row direction, and a distance between each of the contacts leading out of the two sources and the second bit line is greater than a distance between each of the two contacts leading out of the two drains and the second bit line.

A method for reading the aforementioned memory array is also provided according to embodiments. The method may include selecting a first memory bit of the first split-gate flash memory cell by configuring voltages on the first bit line, the second bit line, the word line, the first control gate line, and the second control gate line, so that the first memory bit of the first split-gate flash memory cell is in a to-be-read state; configuring a voltage on the third bit line to prevent memory bits of the second split-gate flash memory cell from being in a to-be-read state; and reading the first memory bit of the first split-gate flash memory cell; wherein the voltage on the second bit line and the voltage on the third bit line are generated by a same voltage source.

In some embodiments, when the first memory bit of the first split-gate flash memory cell is a memory bit farther from the second bit line, the first memory bit of the first split-gate flash memory cell is selected and a channel current is generated in a channel of the first split-gate flash memory cell by applying a voltage of 0 V to the first bit line, applying a voltage ranging from 0.5 V to 1 V to the second bit line and the third bit line, applying a voltage ranging from 4 V to 5 V to the word line, applying a voltage of 0 V to the first control gate line, and applying a voltage ranging from 4 V to 5 V to the second control gate line; and when the first memory bit of the first split-gate flash memory cell is a memory bit closer to the second bit line, the first memory bit of the first split-gate flash memory cell is selected and a channel current is generated in a channel of the first split-gate flash memory cell by applying a voltage ranging from 0.5 V to 1 V to the first bit line, applying a voltage of 0 V to the second bit line and the third bit line, applying a voltage ranging from 4 V to 5 V to the word line, applying a voltage ranging from 4 V to 5 V to the first control gate line and applying a voltage of 0 V to the second control gate line.

A method for programming the aforementioned memory array is also provided according to embodiments. The method may include selecting a first memory bit of the first split-gate flash memory cell by configuring voltages on the first bit line, the second bit line, the word line, the first control gate line, and the second control gate line, so that the first memory bit of the first split-gate flash memory cell is in a to-be-programmed state; configuring a voltage of the third bit line so as to prevent the memory bits of the second split-gate flash memory cell from being in a to-be-programmed state; and programming the first memory bit of the first split-gate flash memory cell; wherein the voltages on the second bit line and the third bit line are generated by a same voltage source.

In some embodiments, when the first memory bit of the first split-gate flash memory cell is a memory bit farther from the second bit line, the first memory bit of the first split-gate flash memory cell is selected and a channel current is generated in a channel of the first split-gate flash memory cell by applying a voltage ranging from 4 V to 7 V to the first bit line, applying a voltage ranging from 0.1 V to 0.5 V to the second bit line and the third bit line, applying a voltage ranging from 1 V to 2 V to the word line, applying a voltage ranging from 7 V to 10 V to the first control gate line and applying a voltage ranging from 4 V to 6 V to the second control gate line; and when the first memory bit of the first split-gate flash memory cell is a memory bit closer to the second bit line, the first memory bit of the first split-gate flash memory cell is selected and a channel current is generated in a channel of the first split-gate flash memory cell by applying a voltage ranging from 0.1 V to 0.5 V to the first bit line, applying a voltage ranging from 4 V to 7 V to the second bit line and the third bit line, applying a voltage ranging from 1 V to 2 V to the word line, applying a voltage ranging from 4 V to 6 V to the first control gate line, and applying a voltage ranging from 7 V to 10 V to the second control gate line.

A method for erasing the aforementioned memory array is also provided according to embodiments. The method may include applying a voltage ranging from 6 V to 10 V to the word line; applying a voltage ranging from −5 V to −9 V to the first control gate line; and applying a voltage ranging from −5 V to −9 V to the second control gate line.

Compared with the prior art, the present disclosure has the following advantages.

In the memory array according to embodiments of the present disclosure, the first split-gate flash memory cell and the second split-gate flash memory cell in each flash memory cell share a second bit line, and the number of bit lines can be reduced when the flash memory cells included in the memory array is fixed. Compared with the prior art, an area of the memory array in the present disclosure can be effectively reduced and cost of the memory can be further decreased.

Further, for a first flash memory cell and a second flash memory cell adjacent to each other in each row of the memory array, contacts leading out of two drains of the first flash memory cell and contacts leading out of two sources of the second flash memory cell are disposed on a same extension line in the row direction, and a distance between each of the contacts leading out of the two sources and the second bit line is greater than a distance between each of the two contacts leading out of the two drains and the second bit line. That is, the third bit line and the first bit line of the two adjacent flash memory cells are not simultaneously connected with a contact, so as to effectively prevent contacts from connecting with each other in an active area of the device due to a short distance between the contacts, where the contact connection may result in function abnormality of the memory array, thereby effectively improving memory yield.

Further, the method for reading the memory array according to embodiments of the present disclosure may include: selecting a first memory bit of the first split-gate flash memory cell by configuring voltages on the first bit line, the second bit line, the word line, the first control gate line, and the second control gate line, so that the first memory bit of the first split-gate flash memory cell can be in a to-be-read state; and configuring a voltage on the third bit line to prevent memory bits of the second split-gate flash memory cell from being in a to-be-read state; wherein the voltages on the second bit line and the third bit line are generated by a same voltage source, so that a current applied to the first split-gate flash memory cell equals a read current generated by a sensitive amplifier without read current loss, to ensure accuracy of the read operation of the memory array.

Further, the method for programming the memory array according to embodiments of the present disclosure may include: selecting a first memory bit of the first split-gate flash memory cell by configuring voltages on the first bit line, the second bit line, the word line, the first control gate line and the second control gate line, so that the first memory bit of the first split-gate flash memory cell can be in a to-be-programmed state; and configuring a voltage on the third bit line, so as to prevent the memory bits of the second split-gate flash memory cell from being in a to-be-programmed state; wherein the voltages on the second bit line and the third bit line are generated by a same voltage source. Therefore, it is not necessary to additionally configure a voltage source for generating a programming suppression voltage, which is easy to implement.

DETAILED DESCRIPTION

As described in the background art, how to reduce an area of a memory array constantly is always a technical problem faced by designers in memory design, since the area of the memory array is closely related to cost of the memory. An area of a memory array in the prior art still remains to be improved.

A memory array is provided according to an embodiment of the present disclosure, including a plurality of flash memory cells arranged in an array, where each of the plurality of flash memory cells may include a first split-gate flash memory cell and a second split-gate flash memory cell sharing a bit line, which can effectively reduce an area of the memory array, thereby further reducing the cost of the memory.

In order to make the above objects, features and beneficial effects of the present disclosure clearer and easier to be understood, specific embodiments of the present disclosure are described in detail below with reference to the accompanying drawings.

Figure 1:
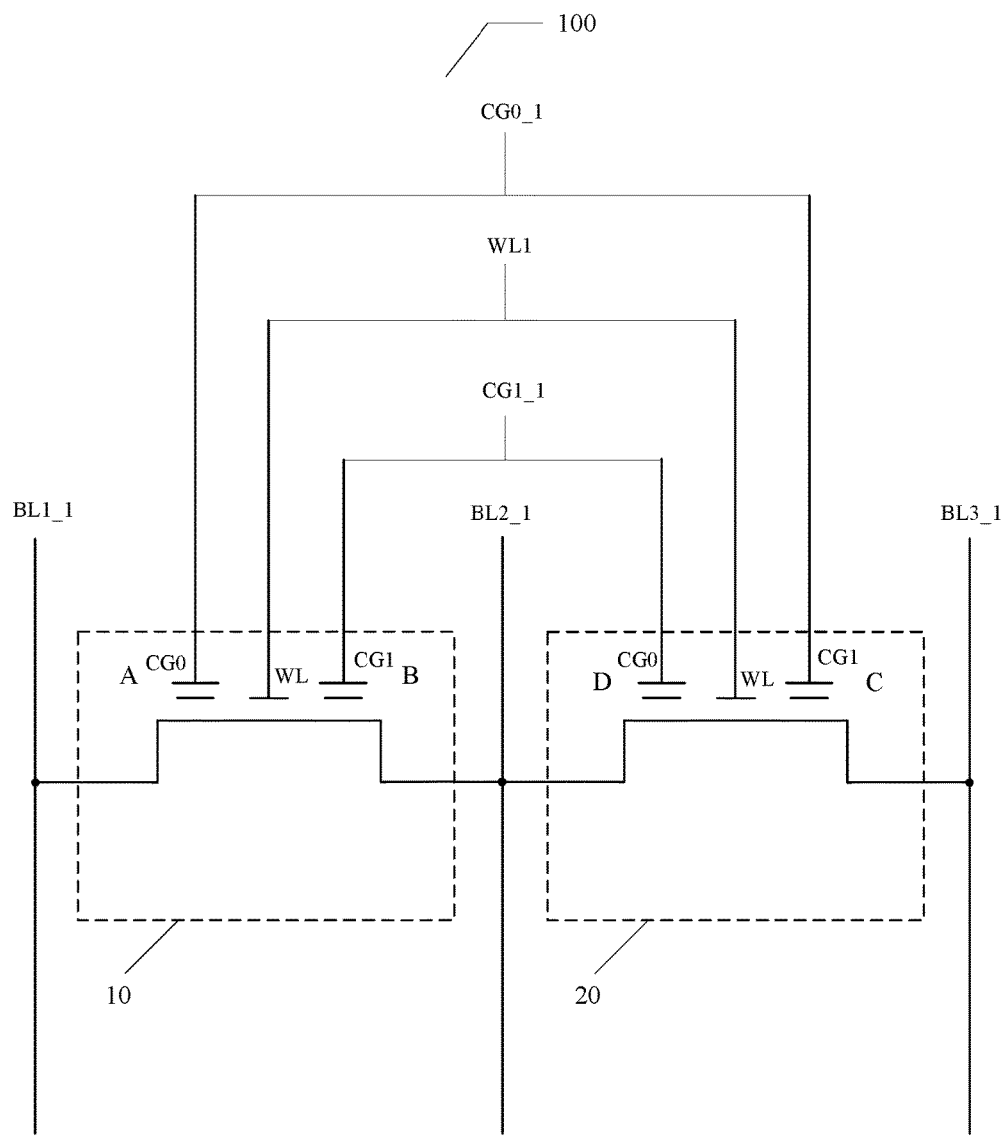
FIG. 1 schematically illustrates a circuit diagram of a flash memory cell according to an embodiment.

As shown in FIG. 1, a memory array (not shown) is provided according to an embodiment. The memory array may include a plurality of flash memory cells 100 arranged in an array, where each of the flash memory cells 100 may include a first split-gate flash memory cell 10 and a second split-gate flash memory cell 20. The first split-gate flash memory cell 10 may include a first memory bit A and a second memory bit B, and the second split-gate flash memory cell 20 may include a first memory bit C and a second memory bit D. the first split-gate flash memory cell 10 and the second split-gate flash memory cell 20 have a same structure, and the structure of the first split-gate flash memory cell 10 will be described as an example below.

Figure 2:
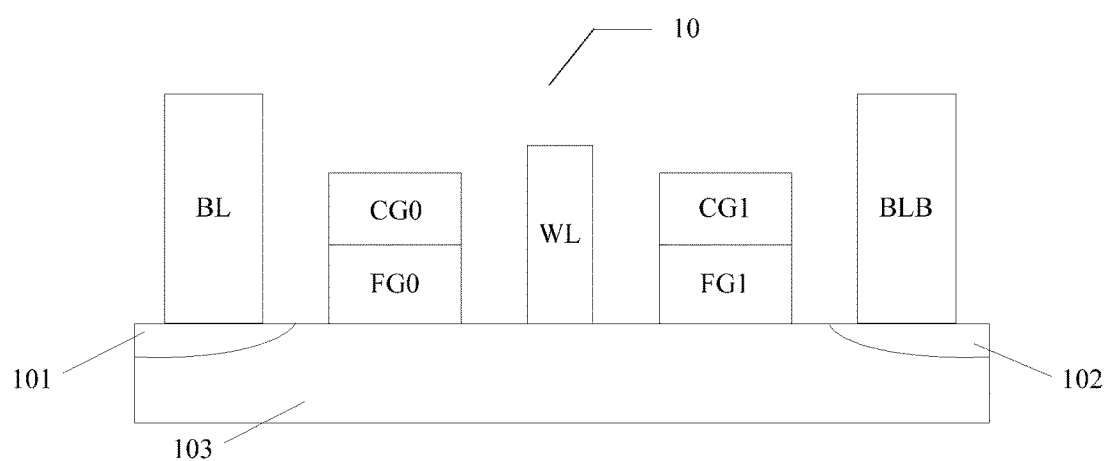
FIG. 2 schematically illustrates a cross-sectional view of a split-gate flash memory cell.

As shown in FIG. 2, in some embodiment, the first split-gate flash memory cell 10 may include a source (not shown), a drain (not shown), a first control gate CG0, a word line gate WL and a second control gate CG1, where the source and the drain are respectively connected with a source region 101 and a drain region 102 formed by an N+ doping region; a P-type doped channel region 103 is formed between the source region 101 and the drain region 102, and the channel region 103 has a surface for forming a channel connecting the source region 101 and the drain region 102. The first control gate CG0, the word line gate WL and the second control gate CG1 are formed over the surface of the channel region 103, and are arranged between the source region 101 and the drain region 102 in a row, the first control gate CG0 and the second control gate CG1 respectively include a floating gate FG0 and a floating gate FG1 for storing charges, so as to form the first memory bit A and the second memory bit B (shown in FIG. 1) of the first split-gate flash memory cell 10. The first control gate CG0 and the second control gate CG1 are symmetric with respect to the word line gate WL, and the source region 101 and the drain region 102 are symmetric. The source may be connected with a first bit line BL, and the drain may be connected with a second bit line BLB.

With continued reference to FIG. 1, a first control gate CG0 of the first split-gate flash memory cell 10 is connected with a first control gate CG0 of the second split-gate flash memory cell 20 and a first control gate line CG0_1, and the second control gate CG1 of the first split-gate flash memory cell 10 is connected with the second control gate CG1 of the second split-gate flash memory cell 20 and a second control gate line CG1_1; and the word line gate WL of the first split-gate flash memory cell 10 is connected with the word line gate WL of the second split-gate flash memory cell 20 and a word line WL1.

The source of the first split-gate flash memory cell 10 is connected with a first bit line BL1_1 via a contact (not shown), the drain of the first split-gate flash memory cell 10 is connected with a second bit line BL2_1 via a contact, the drain of the second split-gate flash memory cell 20 is connected with the second bit line BL2_1 via a contact, and the source of the second split-gate flash memory cell 20 is connected with a third bit line BL3_1 via a contact. The contact may be a through hole filled with a conductive material, but not limited thereto.

In the memory array according to embodiments of the present disclosure, the first split-gate flash memory cell 10 and the second split-gate flash memory cells 20 in each flash memory cell 100 share the second bit line BL2_1. When the number of flash memory cells 100 included in the memory array is fixed, the total number of bit lines is reduced. Since a minimum value of a pitch between adjacent bit lines in a memory array is limited by critical dimensions of semiconductor processes, an area of the memory array according to embodiments of the present disclosure can be effectively reduced and cost of the memory can be further reduced compared with the prior art.

Figure 3:
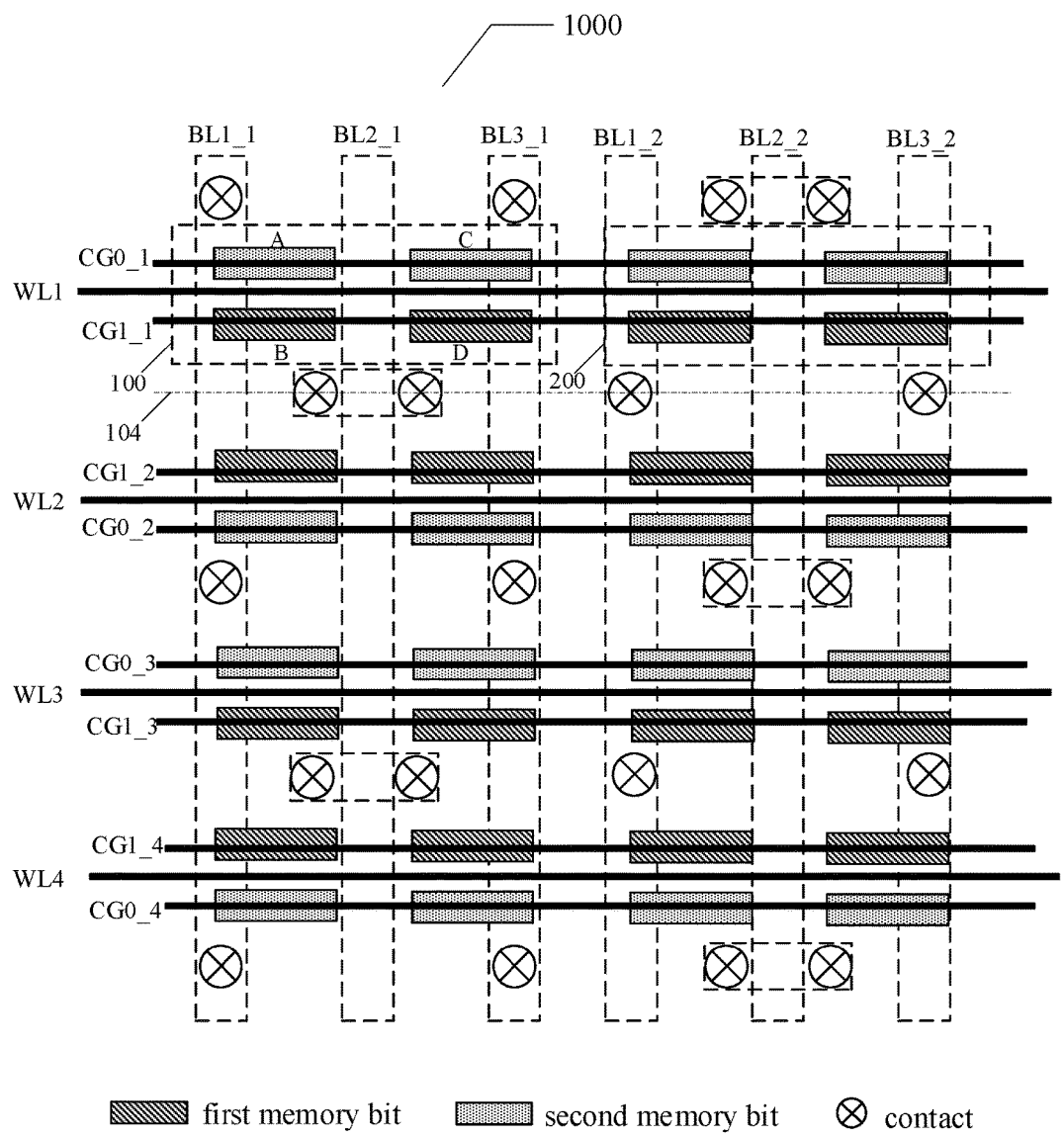
FIG. 3 schematically illustrates a top view of a memory array according to an embodiment.

FIG. 3 schematically illustrates a top view of a memory array 1000 according to an embodiment of the present disclosure. A memory array 1000 including 4 rows and 2 columns of the aforementioned flash memory cells is taken as an example in the present disclosure. The actual number of rows and columns included in the memory array may depend on storage capacity of the memory.

In a first row of the memory array 1000, the first flash memory cell 100 and the second flash memory cell 200 are two adjacent flash memory cells respectively connected with a word line WL1, a first control gate line CG0_1 and a second control gate line CG1_1. The first flash memory cell 100 and flash memory cells in a same column with the first flash memory cell 100 are respectively connected with a first bit line BL1_1, a second bit line BL2_1 and a third bit line BL3_1. The second flash memory cell 200 and flash memory cells in a same column with the second flash memory cell 200 are respectively connected with a first bit line BL1_2, a second bit line BL2_2 and a third bit line BL3_2. Flash memory cells in the second row of the memory array 1000 are respectively connected with a word line WL2, a first control gate line CG0_2 and a second control gate line CG1_2, flash memory cells in the third row of the memory array 1000 are respectively connected with a word line WL3, a first control gate line CG0_3, and a second control gate line CG1_3, and flash memory cells in the fourth row of the memory array 1000 are respectively connected with a word line WL4, a first control gate line CG0_4 and a second control gate line CG1_4.

In some embodiments, contacts leading out of two drains of the first flash memory cell 100, i.e., the two contacts connected with the second bit line BL2_1, and contacts leading out of two sources of the second flash memory cell 200, i.e., the two contacts respectively connected with the first bit line BL1_2 and the third bit line BL3_2 are arranged on a same extension line 104 in a row direction, and a distance between each of the two contacts leading out of the two sources and the second bit line BL2_2 is greater than a distance between each of the two contacts leading out of the two drains and the second bit line BL2_1. By analogy, the above-mentioned characteristics are present for every two adjacent flash memory cells in other rows of the memory array 1000.

Since for every two adjacent flash memory cells in each row of the memory array 1000, contacts leading out of two drains of one of the two adjacent flash memory cells and contacts leading out of two sources of the other of the two adjacent flash memory cells are arranged in a same extension line in a row direction, and the contacts leading out of the two drains are connected with a shared second bit line in the one flash memory cell, and the contacts leading out of the two sources are respectively connected with a first bit line and a third bit line of the other flash memory cell. Therefore, the third bit line and the first bit line (e.g., the third bit line BL3_1 and the first bit line BL1_2 in FIG. 3) of the two adjacent flash memory cells are not simultaneously connected with contacts in an extension line in a same row direction, which can effectively prevent contacts from connecting with each other due to a short distance between adjacent contacts, where the connection of contacts may result in function abnormity of the memory array, thereby effectively improving yield of memory.

Further, a method for reading the above memory array is also provided according to an embodiment of the present disclosure. With continued reference to FIG. 1, in some embodiments, the memory array may include a plurality of flash memory cells 100 arranged in an array, and each of the plurality of flash memory cells 100 may include a first split-gate flash memory cell 10 and a second split-gate flash memory cell 20.

The method for reading the memory array may include the following steps with an execution sequence not limited thereto.

A first memory bit A or B of the first split-gate flash memory cell 10 is selected by configuring voltages on the first bit line BL1_1, the second bit line BL2_1, the word line WL1, the first control gate line CG0_1 and the second control gate line CG1_1, so that the first memory bit A or B of the first split-gate flash memory cell is in a to-be-read state.

A voltage on the third bit line BL3_1 is configured to prevent memory bits C and D of the second split-gate flash memory cell 20 from being in a to-be-read state.

The first memory bit A or B of the first split-gate flash memory cell 10 is read.

In some embodiment, a voltage is applied to the word line WL1 and a voltage is also applied to the first bit line BL1_1 and the second bit line BL2_1, so that a current can be generated between the source and the drain of the first split-gate flash memory cell 10 due to movement of a large number of electrons. Current on the first bit line BL1_1 or the second bit line BL2_1 may be read by a Sensitive Amplifier (SA) to determine an amount of electrons stored in a floating gate, so as to achieve reading data stored in the first split-gate flash memory cell 10. Specifically, when the current is large, the read data may be 1, and when the current is small, the read data may be 0. A first input terminal of the SA may be connected with a reference voltage, and a second input terminal of the SA may be connected with the first bit line BL1_1 and the second bit line BL2_1 via a vertical decoder. Before a read operation, under selection of the vertical decoder, the first bit line BL1_1 or the second bit line BL2_1 is precharged by a voltage source so that a voltage on the first bit line BL1_1 or the second bit line BL2_1 is equal to the reference voltage. During the read operation, the SA outputs a read current Isense (shown in FIG. 4), if a channel current Icell (shown in FIG. 4) in the first memory bit A or B is greater than the read current Isense, then a voltage at the second input terminal of the SA will decrease, If the channel current Icell is 0 and less than the read current Isense, the voltage at the second input terminal of the SA will increase, and the SA judges the read current Isense according to a logic level output by the SA, so as to determine the data stored in the first memory bit A or B being 1 or 0.

In some embodiment, a voltage on the third bit line BL3_1 may be configured to be equal to a voltage on the second bit line BL2_1, so that a channel current cannot be generated in the second split-gate flash memory cell 20, to prevent the memory bits C and D of the second split-gate flash memory cell 20 from being in a to-be-read state.

Figure 4:
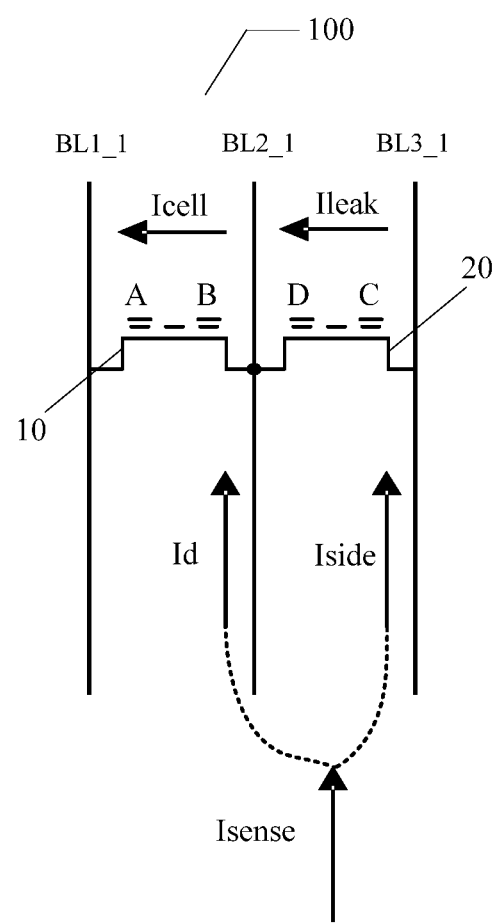
FIG. 4 schematically illustrates a diagram of a method for reading the flash memory cell shown in FIG. 1.

FIG. 4 schematically illustrates a diagram of a method for reading the flash memory cell shown in FIG. 1. As shown in FIG. 4, voltages on the second bit line BL2_1 and the third bit line BL3_1 are generated by a same voltage source (not shown). Taking the first memory bit being the memory bit A farther from the second bit line BL2_1 as an example, a voltage of 0 V may be applied to the first bit line BL1_1 during a read operation, and the same voltage may be applied to the second bit line BL2_1 and the third bit line BL3_1 simultaneously via the voltage source. Then, the read current Isense generated by the SA may be equal to a sum of a current Id on the second bit line BL2_1 and a current Iside on the third bit line BL3_1. Further, the current Iside on the third bit line BL3_1 may be equal to a leakage current Ileak on the second split-gate flash memory cell 20, and according to the Kirchhoff's current law, a current Icel applied to the first split-gate flash memory cell 10 is equal to a sum of the Id and the Ileak, so that the current Icel applied to the first split-gate flash memory cell 10 is equal to the read current Isense generated by the SA without read current loss, thereby improving accuracy of read operations of the memory array.

In some embodiment, when the first memory bit of the first split-gate flash memory cell 10 is the memory bit A farther away from the second bit line BL2_1, the first memory bit A of the first split-gate flash memory cell 10 may be selected and a channel current may be generated in a channel of the first split-gate flash memory cell 10 by applying a voltage of 0 V to the first bit line BL1_1, applying a voltage ranging from 0.5 V to 1 V to the second bit line BL2_1 and the third bit line BL3_1, applying a voltage ranging from 4 V to 5 V to the word line WL1, applying a voltage of 0 V to the first control gate line CG0_1 and applying a voltage ranging from 4 V to 5 V to the second control gate line CG1_1.

When the first memory bit of the first split-gate flash memory cell 10 is the memory bit B closer to the second bit line BL2_1, the first memory bit B of the first split-gate flash memory cell 10 may be selected and a channel current may be generated in a channel of the first split-gate flash memory cell 10 by applying a voltage ranging from 0.5 V to 1 V to the first bit line BL1_1, applying a voltage of 0 V to the second bit line BL2_1 and the third bit line BL3_1, applying a voltage ranging from 4 V to 5 V to the word line WL1, applying a voltage ranging from 4 V to 5 V to the first control gate line CG0_1, and applying a voltage of 0 V to the second control gate line CG1_1.

In some embodiment, voltages may be applied to each of the bit lines, the word lines, and the control gate lines described above as shown in Table 1 below, so as to read different memory bits, where a voltage applied to a substrate is 0 V. It should be noted that, since the first split-gate flash memory cell 10 and the second split-gate flash memory cell 20 have a same structure, a method for reading the two memory bits of the second split-gate flash memory cell 20 may refer to that of the first split-gate flash memory cell 10, which will not be described in detail herein.

TABLE 1

| operation | memory bit | BL0 | BL1 | BL2 | WL | CG0 | CG1 | sub-strate |
|---|---|---|---|---|---|---|---|---|
| reading | A | 0 | 0.8 | 0.8 | 4.5 | 0 | 4.5 | 0 |
|  | B | 0.8 | 0 | 0 | 4.5 | 4.5 | 0 | 0 |
|  | C | 0.8 | 0.8 | 0 | 4.5 | 0 | 4.5 | 0 |
|  | D | 0 | 0 | 0.8 | 4.5 | 4.5 | 0 | 0 |

Further, a method for programming the aforementioned memory array is also provided according to an embodiment of the present disclosure. With continued reference to FIG. 1, the method for programming the memory array may include the following steps with an execution sequence not limited thereto.

The first memory bit A or B of the first split-gate flash memory cell 10 is selected by configuring voltages on the first bit line BL1_1, the second bit line BL2_1, the word line WL1, the first control gate line CG0_1 and the second control gate line CG1_1, so that the first memory bit A or B of the first split-gate flash memory cell 10 is in a to-be-programmed state.

A voltage on the third bit line BL3_1 is configured so as to prevent the memory bits C and D of the second split-gate flash memory cell 20 from being in a to-be-programmed state.

The first memory bit A or B of the first split-gate flash memory cell is programmed.

In some embodiment, a high positive voltage may be applied to the control gate line connected with the floating gate corresponding to the first memory bit A or B, and a voltage may be applied to the first bit line BL1_1 and the second bit line BL2_1, so that a channel current may be generated between the source and the drain of the first split-gate flash memory cell 10 to increase energy of electrons conducted between the source and the drain. When hot electrons are injected into the to-be-programmed floating gate, programming is completed.

In some embodiment, a voltage on the third bit line BL3_1 may be configured to be equal to a voltage on the second bit line BL2_1, so that a channel current cannot be generated in the second split-gate flash memory unit 20 to prevent the memory bits C and D of the second split-gate flash memory cell 20 from being in a to-be-programmed state, and the voltage on the third bit line BL3_1 is generally a programming suppression voltage.

In some embodiment, the voltages on the second bit line and the third bit line may be generated by a same voltage source, which is easy to implement without additional configuration of a voltage source for generating the programming suppression voltage.

In some embodiment, when the first memory bit of the first split-gate flash memory cell 10 is the memory bit A farther from the second bit line BL2_1, the first memory bit A of the first split-gate flash memory cell 10 may be selected and a channel current may be generated in the channel of the first split-gate flash memory cell 10 by applying a voltage ranging from 4 V to 7 V to the first bit line BL1_1, applying a voltage ranging from 0.1 V to 0.5 V to the second bit line BL2_1 and the third bit line BL3_1, applying a voltage ranging from 1 V to 2 V to the word line WL1, applying a voltage ranging from 7 V to 10 V to the first control gate line CG0_1 and applying a voltage ranging from 4 V to 6 V to the second control gate line CG1_1.

When the first memory bit of the first split-gate flash memory cell 10 is the memory bit B closer to the second bit line BL2_1, the first memory bit B of the first split-gate flash memory cell 10 may be selected and a channel current may be generated in the channel of the first split-gate flash memory cell 10 by applying a voltage ranging from 0.1 V to 0.5 V to the first bit line BL1_1, applying a voltage ranging from 4 V to 7 V to the second bit line BL2_1 and the third bit line BL3_1, applying a voltage ranging from 1 V to 2 V to the word line WL1, applying a voltage ranging from 4 V to 6 V to the first control gate line CG0_1, and applying a voltage ranging from 7 V to 10 V to the second control gate line CG1_1.

In some embodiment, voltages values (in a unit of V) shown in Table 1 may be applied to each of the aforementioned bit lines, word lines, and control gate lines to program different memory bits, where a voltage of a substrate is 0 V. The voltage of 0.1 V to 0.5 V described above may be a programming voltage Vdp as shown in Table 2 below. In some embodiment, the programming voltage Vdp may be generated by an appropriate voltage source or a current source via an impedance circuit.

It should be noted that, since the first split-gate flash memory cell 10 and the second split-gate flash memory cell 20 have a same structure, a method for programming the two memory bits of the second split-gate flash memory cell 20 may refer to that of the first split-gate flash memory cell 10, which will not be described in detail herein.

TABLE 2

| operation | memory bit | BL0 | BL1 | BL2 | WL | CG0 | CG1 | sub-strate |
|---|---|---|---|---|---|---|---|---|
| program-ming | A | 5.5 | Vdp | Vdp | 1.5 | 8.5 | 5 | 0 |
| | B | Vdp | 5.5 | 5.5 | 1.5 | 5 | 8.5 | 0 |
| | C | Vdp | Vdp | 5.5 | 1.5 | 8.5 | 5 | 0 |
| | D | 5.5 | 5.5 | Vdp | 1.5 | 5 | 8.5 | 0 |

Further, a method for erasing the aforementioned memory array is also provided according to an embodiment of the present disclosure. With continued reference to FIG. 1, the method for erasing the memory array may include the following steps with an execution sequence not limited thereto.

A voltage ranging from 6 V to 10 V, such as 8 V, is applied to the word line WL1.

A voltage ranging from −5 V to −9 V, such as −7 V, is applied to the first control gate line CG0_1.

A voltage ranging from −5 V to −9 V, such as −7 V, is applied to the second control gate line CG1_1.

In some embodiment, during erasing of the first split-gate flash memory cell 10 and/or the second split-gate flash memory cell 20, electrons injected to the floating gate are drawn to the source by virtue of a tunnel effect between a floating gate and a source, so that electrons are no longer stored in the floating gate, thereby achieving erasure.

In some embodiment, a voltage of each bit line may be set as 0 V.

Although the present disclosure has been described above, the present disclosure is not limited thereto. It should be understood by those skilled in the art that various changes and modifications may be made without departing from the spirit and scope of the disclosure, and therefore, the scope of the disclosure should be limited by the scope of the claims.

What is claimed is:

1. A memory array, comprising a plurality of flash memory cells arranged in an array, wherein each of the plurality of flash memory cells comprises a first split-gate flash memory cell and a second split-gate flash memory cell, each of the first split-gate flash memory cell and the second split-gate flash memory cell comprises a source, a drain, a first control gate, a word line gate and a second control gate;

the first control gate of the first split-gate flash memory cell is connected with the first control gate of the second split-gate flash memory cell and a first control gate line, the second control gate of the first split-gate flash memory cell is connected with the second control gate of the second split-gate flash memory cell and a second control gate line; the word line gate of the first split-gate flash memory cell is connected with the word line gate of the second split-gate flash memory cell and a word line; and the source of the first split-gate flash memory cell is connected with a first bit line via a contact, the drain of the first split-gate flash memory cell is connected with a second bit line via a contact, the drain of the second split-gate flash memory cell is connected with the second bit line via a contact, and the source of the second split-gate flash memory cell is connected with a third bit line via a contact; and wherein for a first flash memory cell and a second flash memory cell adjacent to each other in the flash memory cells in each row of the memory array, contacts leading out of two drains of the first flash memory cell and contacts leading out of two sources of the second flash memory cell are disposed on a same extension line in the row direction, and a distance between each of the contacts leading out of the two sources and the second bit line is greater than a distance between each of the two contacts leading out of the two drains and the second bit line.

2. A method for reading a memory array, comprising:

selecting a first memory bit of the first split-gate flash memory cell by configuring voltages on the first bit line, the second bit line, the word line, the first control gate line, and the second control gate line, so that the first memory bit of the first split-gate flash memory cell is in a to-be-read state;

configuring a voltage on the third bit line to prevent memory bits of the second split-gate flash memory cell from being in a to-be-read state; and reading the first memory bit of the first split-gate flash memory cell;

wherein the voltage on the second bit line and the voltage on the third bit line are generated by a same voltage source;

wherein the memory array comprises a plurality of flash memory cells arranged in an array, wherein each of the plurality of flash memory cells comprises a first split-gate flash memory cell and a second split-gate flash memory cell, each of the first split-gate flash memory cell and the second split-gate flash memory cell comprises a source, a drain, a first control gate, a word line gate and a second control gate;

the first control gate of the first split-gate flash memory cell is connected with the first control gate of the second split-gate flash memory cell and a first control gate line, the second control gate of the first split-gate flash memory cell is connected with the second control gate of the second split-gate flash memory cell and a second control gate line; the word line gate of the first split-gate flash memory cell is connected with the word line gate of the second split-gate flash memory cell and a word line; and the source of the first split-gate flash memory cell is connected with a first bit line via a contact, the drain of the first split-gate flash memory cell is connected with a second bit line via a contact, the drain of the second split-gate flash memory cell is connected with the second bit line via a contact, and the source of the second split-gate flash memory cell is connected with a third bit line via a contact; and wherein for a first flash memory cell and a second flash memory cell adjacent to each other in the flash memory cells in each row of the memory array, contacts leading out of two drains of the first flash memory cell and contacts leading out of two sources of the second flash memory cell are disposed on a same extension line in the row direction, and a distance between each of the contacts leading out of the two sources and the second bit line is greater than a distance between each of the two contacts leading out of the two drains and the second bit line.

3. The method according to claim 2, wherein when the first memory bit of the first split-gate flash memory cell is a memory bit farther from the second bit line, the first memory bit of the first split-gate flash memory cell is selected and a channel current is generated in a channel of the first split-gate flash memory cell by applying a voltage of 0 V to the first bit line, applying a voltage ranging from 0.5 V to 1 V to the second bit line and the third bit line, applying a voltage ranging from 4 V to 5 V to the word line, applying a voltage of 0 V to the first control gate line, and applying a voltage ranging from 4 V to 5 V to the second control gate line; and when the first memory bit of the first split-gate flash memory cell is a memory bit closer to the second bit line, the first memory bit of the first split-gate flash memory cell is selected and a channel current is generated in a channel of the first split-gate flash memory cell by applying a voltage ranging from 0.5 V to 1 V to the first bit line, applying a voltage of 0 V to the second bit line and the third bit line, applying a voltage ranging from 4 V to 5 V to the word line, applying a voltage ranging from 4 V to 5 V to the first control gate line and applying a voltage of 0 V to the second control gate line.

4. A method for programming a memory array, comprising:

selecting a first memory bit of the first split-gate flash memory cell by configuring voltages on the first bit line, the second bit line, the word line, the first control gate line, and the second control gate line, so that the first memory bit of the first split-gate flash memory cell is in a to-be-programmed state;

configuring a voltage of the third bit line so as to prevent the memory bits of the second split-gate flash memory cell from being in a to-be-programmed state; and programming the first memory bit of the first split-gate flash memory cell;

wherein the voltages on the second bit line and the third bit line are generated by a same voltage source;

wherein the memory array comprises a plurality of flash memory cells arranged in an array, wherein each of the plurality of flash memory cells comprises a first split-gate flash memory cell and a second split-gate flash memory cell, each of the first split-gate flash memory cell and the second split-gate flash memory cell comprises a source, a drain, a first control gate, a word line gate and a second control gate;

the first control gate of the first split-gate flash memory cell is connected with the first control gate of the second split-gate flash memory cell and a first control gate line, the second control gate of the first split-gate flash memory cell is connected with the second control gate of the second split-gate flash memory cell and a second control gate line; the word line gate of the first split-gate flash memory cell is connected with the word line gate of the second split-gate flash memory cell and a word line; and the source of the first split-gate flash memory cell is connected with a first bit line via a contact, the drain of the first split-gate flash memory cell is connected with a second bit line via a contact, the drain of the second split-gate flash memory cell is connected with the second bit line via a contact, and the source of the second split-gate flash memory cell is connected with a third bit line via a contact; and wherein for a first flash memory cell and a second flash memory cell adjacent to each other in the flash memory cells in each row of the memory array, contacts leading out of two drains of the first flash memory cell and contacts leading out of two sources of the second flash memory cell are disposed on a same extension line in the row direction, and a distance between each of the contacts leading out of the two sources and the second bit line is greater than a distance between each of the two contacts leading out of the two drains and the second bit line.

5. The method according to claim 4, wherein when the first memory bit of the first split-gate flash memory cell is a memory bit farther from the second bit line, the first memory bit of the first split-gate flash memory cell is selected and a channel current is generated in a channel of the first split-gate flash memory cell by applying a voltage ranging from 4 V to 7 V to the first bit line, applying a voltage ranging from 0.1 V to 0.5 V to the second bit line and the third bit line, applying a voltage ranging from 1 V to 2 V to the word line, applying a voltage ranging from 7 V to 10 V to the first control gate line and applying a voltage ranging from 4 V to 6 V to the second control gate line; and when the first memory bit of the first split-gate flash memory cell is a memory bit closer to the second bit line, the first memory bit of the first split-gate flash memory cell is selected and a channel current is generated in a channel of the first split-gate flash memory cell by applying a voltage ranging from 0.1 V to 0.5 V to the first bit line, applying a voltage ranging from 4 V to 7 V to the second bit line and the third bit line, applying a voltage ranging from 1 V to 2 V to the word line, applying a voltage ranging from 4 V to 6 V to the first control gate line, and applying a voltage ranging from 7 V to 10 V to the second control gate line.

* * * * *